United States Patent
Liu

(10) Patent No.: US 8,669,808 B2
(45) Date of Patent: Mar. 11, 2014

(54) BIAS CIRCUIT AND PHASE-LOCKED LOOP CIRCUIT USING THE SAME

(75) Inventor: Shiue-Shin Liu, HsinChu (TW)

(73) Assignee: MediaTek Inc., Science-Based Industrial Park, Hsin-Chu (TW)

( * ) Notice: Subject to any disclaimer, the term of this patent is extended or adjusted under 35 U.S.C. 154(b) by 223 days.

(21) Appl. No.: 12/757,043

(22) Filed: Apr. 9, 2010

(65) Prior Publication Data

US 2011/0063002 A1 Mar. 17, 2011

Related U.S. Application Data

(60) Provisional application No. 61/242,004, filed on Sep. 14, 2009.

(51) Int. Cl.
*G05F 1/10* (2006.01)

(52) U.S. Cl.
USPC ............................ 327/540; 327/156; 327/513

(58) Field of Classification Search
None
See application file for complete search history.

(56) References Cited

U.S. PATENT DOCUMENTS

| | | | | |
|---|---|---|---|---|
| 3,522,521 A | * | 8/1970 | Lloyd | 323/313 |
| 4,009,432 A | * | 2/1977 | Dingwall et al. | 323/267 |
| 5,121,049 A | * | 6/1992 | Bass | 323/313 |
| 5,315,230 A | * | 5/1994 | Cordoba et al. | 323/313 |
| 5,391,979 A | * | 2/1995 | Kajimoto et al. | 323/313 |
| 5,801,580 A | * | 9/1998 | Wu | 327/538 |
| 5,828,604 A | * | 10/1998 | Kawai et al. | 365/185.22 |
| 5,880,582 A | * | 3/1999 | Sawada | 323/315 |
| 5,982,201 A | * | 11/1999 | Brokaw et al. | 327/53 |
| 6,060,918 A | * | 5/2000 | Tsuchida et al. | 327/143 |
| 6,087,821 A | * | 7/2000 | Kojima | 323/315 |
| 6,400,185 B2 | * | 6/2002 | Pavan | 327/543 |
| 6,448,811 B1 | * | 9/2002 | Narendra et al. | 326/82 |
| 6,472,929 B2 | * | 10/2002 | Kobayashi et al. | 327/540 |
| 6,518,833 B2 | * | 2/2003 | Narendra et al. | 327/541 |
| 6,570,947 B1 | * | 5/2003 | Zipper et al. | 375/376 |
| 6,737,909 B2 | * | 5/2004 | Jaussi et al. | 327/541 |
| 6,806,764 B2 | * | 10/2004 | Inagaki et al. | 327/543 |
| 6,844,782 B2 | * | 1/2005 | Otaka | 330/254 |
| 6,919,753 B2 | * | 7/2005 | Wang et al. | 327/513 |
| 6,946,896 B2 | | 9/2005 | Behzad | |
| 7,042,205 B2 | * | 5/2006 | Tseng et al. | 323/315 |
| 7,119,605 B2 | * | 10/2006 | Eberlein | 327/538 |

(Continued)

OTHER PUBLICATIONS

Brownlee, A 0.5 to 2.5GHz PLL with Fully Differential Supply-Regulated Tuning, ISSCC 2006/ Session 32/ PLLs, VCOs, and Dividers/ 32.2, 2006.

(Continued)

*Primary Examiner* — Thomas J Hiltunen
(74) *Attorney, Agent, or Firm* — Winston Hsu; Scott Margo

(57) ABSTRACT

A bias circuit for generating an output bias current includes a first transistor, a passive component, a second transistor, and a bias current generator. The first transistor has a first node coupled to a first reference voltage, a second node, and a control node. The passive component is coupled between the first reference voltage and the control node of the first transistor. The second transistor has a first node coupled to the control node of the first transistor, a control node coupled to the second node of the first transistor, and a second node for providing the output bias current according to a current passing through the passive component. The bias current generator is coupled to the second node of the first transistor, and implemented for providing the first transistor with a bias current.

25 Claims, 9 Drawing Sheets

(56) References Cited

U.S. PATENT DOCUMENTS

| | | | | |
|---|---|---|---|---|
| 7,218,170 | B1* | 5/2007 | Carter et al. | 327/552 |
| 7,298,221 | B2* | 11/2007 | Yan | 331/17 |
| 7,312,663 | B2* | 12/2007 | Abel | 331/16 |
| 7,397,226 | B1* | 7/2008 | Mannama et al. | 323/273 |
| 7,463,101 | B2* | 12/2008 | Tung | 331/57 |
| 7,486,572 | B2* | 2/2009 | Luo et al. | 365/189.09 |
| 7,495,507 | B2 | 2/2009 | Choi | |
| 7,595,695 | B2* | 9/2009 | Tenbroek | 330/292 |
| 7,602,255 | B1* | 10/2009 | Lai et al. | 331/16 |
| 7,786,771 | B2* | 8/2010 | Tsai et al. | 327/156 |
| 7,791,401 | B1* | 9/2010 | Chiu | 327/513 |
| 7,956,672 | B2* | 6/2011 | Aota | 327/530 |
| 2002/0036536 | A1* | 3/2002 | Wada et al. | 327/538 |
| 2002/0039044 | A1* | 4/2002 | Kwak et al. | 327/540 |
| 2002/0043669 | A1 | 4/2002 | Kobayashi | |
| 2004/0207380 | A1* | 10/2004 | Ariki | 323/313 |
| 2005/0174185 | A1 | 8/2005 | Steinbach | |
| 2007/0057717 | A1* | 3/2007 | Choi | 327/543 |
| 2009/0295439 | A1* | 12/2009 | Tsai et al. | 327/156 |
| 2010/0259315 | A1* | 10/2010 | Lin | 327/538 |

OTHER PUBLICATIONS

Desai, A Dual-Supply 0.2-to-4GHz PLL Clock Multiplier in a 65nm Dual-Oxide CMOS Process, ISSCC 2007/ Session 17/ Analog Techniques and PLLs/ 17.4/ pp. 308-309 & pp. 605, 2007.

Iniewski, K. et al., "Phase Locked Loop gain shaping for gigahertz operation", Circuits and Systems, 2004. ISCAS '04. Proceedings of the 2004 International Symposium on, vol. 4, pp. IV-157~IV-160, May 23-26, 2004, 2004 IEEE.

* cited by examiner

BIAS CIRCUIT AND PHASE-LOCKED LOOP CIRCUIT USING THE SAME

CROSS REFERENCE TO RELATED APPLICATIONS

This application claims the benefit of U.S. Provisional Application No. 61/242,004, filed on Sep. 14, 2009 and included herein by reference.

BACKGROUND

The disclosed embodiments of the present invention relate to generating a bias current, and more particularly, to a bias circuit and a phase-locked loop circuit using the same.

Due to the advance of the integrated circuit fabrication technology, reduced minimum channel width and supply voltage improve speed, power and area consumption of a digital circuit. However, this trend toward higher level integration complicates the design of an analog supportive circuit, such as a ring-type phase-locked loop (PLL) circuit that is used to generate clocks in a high performance system.

One challenge to PLL design in advanced process is the inevitably large gain of voltage controlled oscillator (VCO). Taking a PLL circuit with GHz output frequency for example, the VCO gain as large as several GHz/Volt is usually needed to cover process and temperature variation. However, this large VCO gain brings several drawbacks in the PLL circuit. First, noise injected on the control voltage node is amplified by the large gain. Second, for a given loop bandwidth, a large stabilizing capacitor must be used in a high VCO gain design. Therefore, an innovative PLL circuit with low jitter and low VCO gain is highly demanded.

SUMMARY

In accordance with exemplary embodiments of the present invention, a bias circuit and a phase-locked loop circuit using the same are proposed.

According to a first aspect of the present invention, a bias circuit for generating an output bias current is provided. The bias circuit includes a first transistor, a passive component, a second transistor, and a bias current generator. The first transistor has a first node coupled to a first reference voltage, a second node, and a control node. The passive component is coupled between the first reference voltage and the control node of the first transistor. The second transistor has a first node coupled to the control node of the first transistor, a control node coupled to the second node of the first transistor, and a second node for providing the output bias current according to a current passing through the passive component. The bias current generator is coupled to the second node of the first transistor, and implemented for providing the first transistor with a bias current.

According to a second aspect of the present invention, a phase-locked loop (PLL) circuit is provided. The PLL circuit includes a phase-frequency detector (PFD), a charge pump, a loop filter, a bias circuit, and a current-controlled oscillator (ICO). The PFD is implemented for comparing a reference clock signal with a feedback clock signal to generate a comparison result. The charge pump is implemented for generating a charge pump output according to the comparison result. The loop filter is implemented for generating a control current according to the charge pump output. The bias circuit includes: a first transistor, having a first node coupled to a first reference voltage, a second node, and a control node; a passive component, coupled between the first reference voltage and the control node of the first transistor; a second transistor, having a first node coupled to the control node of the first transistor, a control node coupled to the second node of the first transistor, and a second node for providing a band selection current passing through the passive component; and a bias current generator, coupled to the second node of the first transistor, for providing the first transistor with a bias current. The ICO is implemented for generating an output clock signal according to the band selection current and the control current, wherein the feedback clock signal is derived from the output clock signal.

According to a third aspect of the present invention, a bias circuit is disclosed. The bias circuit includes a first transistor, a feedback control loop, a second transistor, and a constant transconductance bias unit. The first transistor has a first node coupled to a first reference voltage, a second node, and a control node. The feedback control loop is coupled between the control node and the second node of the first transistor, and arranged to force a current passing through the first transistor substantially equal to a bias current. The second transistor has a first node coupled to the second node of the first transistor, a second node coupled to a second reference voltage, and a control node. The constant transconductance bias unit is coupled to the control node of the second transistor, and implemented for biasing the second transistor to provide the bias current and making a gate-source voltage of the first transistor substantially temperature independent.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

One objective of the present invention is to provide a bias circuit for generating an output bias current to a target device, such as a current controlled oscillator (ICO) or other circuit which requires a bias current. The proposed bias circuit may be configured to be a low noise, temperature independent (LNTI) bias circuit or low noise, temperature compensated (LNTC) bias circuit. However, this is for illustrative purposes only, and any circuit having such proposed bias circuit falls within the scope of the present invention. Another objective of the present invention is to provide a PLL circuit which has the proposed bias circuit employed therein. By way of example, but not limitation, a low jitter, low cost general purpose PLL circuit can be realized by employing the proposed bias circuit properly configured to act as an LNTI bias circuit or LNTC bias circuit. Further details will be described in the following paragraphs.

Figure 1:
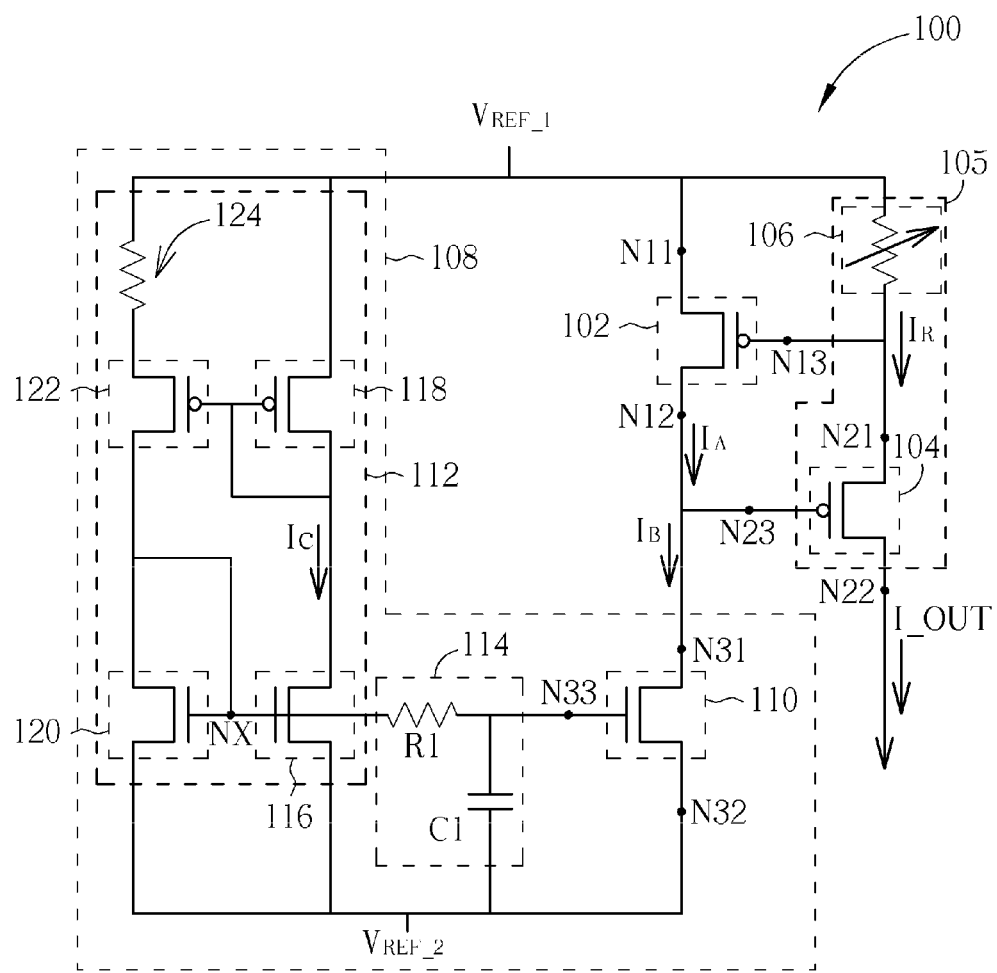
FIG. 1 is a diagram illustrating an exemplary embodiment of a bias circuit according to the present invention.

FIG. 1 is a diagram illustrating an exemplary embodiment of a bias circuit according to the present invention. The exemplary bias circuit 100 is utilized for generating an output bias current IOUT, and includes, but is not limited to, a first transistor 102, a second transistor 104, a passive component 106, and a bias current generator 108. As shown in FIG. 1, the first transistor 102 has a first node (i.e., source terminal) N11 coupled to a first reference voltage $V_{REF\_1}$, a second node (i.e., drain terminal) N12, and a control node (i.e., gate terminal) N13. The passive component 106 is coupled between the first reference voltage $V_{REF\_1}$ and the control node N13 of the first transistor 102. The second transistor 104 has a first node (i.e., source terminal) N21 coupled to the control node N13 of the first transistor 102, a control node (i.e., gate terminal) N23 coupled to the second node N12 of the first transistor 102, and a second node (i.e., drain terminal) N22 for providing the output bias current IOUT according to a current $I_R$ passing through the passive component 106. The bias current generator 108 is coupled to the second node N12 of the first transistor 102, and implemented for providing the first transistor 102 with a bias current $I_B$. The passive component 106 may be a resistive element. For example, the passive component 106 in this exemplary embodiment is implemented using a variable resistor which is arranged for adjusting the current $I_R$ passing therethrough. Furthermore, in this exemplary embodiment, the first reference voltage $V_{REF\_1}$ is a supply voltage (high voltage), while the second reference voltage $V_{REF\_2}$ is a ground voltage (low voltage).

Regarding the bias current generator 108 of the present embodiment, it includes, but is not limited to, a third transistor 110, a bias unit 112, and an optional low-pass filter 114. As shown in FIG. 1, the third transistor 110 has a first node (i.e., drain terminal) N31 coupled to the second node N12 of the first transistor 102, a second node (i.e., source terminal) N32 coupled to a second reference voltage $V_{REF\_2}$, and a control node (i.e., gate terminal) N33. The bias unit 112 is coupled to the control node N33 of the third transistor 110, and implemented for biasing the third transistor 110 to provide the bias current $I_B$. By way of example, but not limitation, the bias unit 112 is implemented using a constant transconductance bias unit which includes a first specific transistor 116, a second specific transistor 118, a third specific transistor 120, a fourth specific transistor 122, and a specific resistive element 124, where the control node NX of the first specific transistor 116 and the third specific transistor 120 is coupled to the control node N33 of the third transistor 110. The first specific transistor 116 and the second specific transistor 118 are connected in a cascode fashion, and the third specific transistor 120 and the fourth specific transistor 122 are connected in a cascode fashion. In addition, in one exemplary design of the constant transconductance bias circuit, the aspect ratio (W/L) of the second specific transistor 118 is K times as great as that of the fourth specific transistor 122. For example, K=4. It should be noted that FIG. 1 only shows fundamental elements required for realizing a constant transconductance bias unit serving as the bias unit 112. Additional element(s) may be added to the circuit structure shown in FIG. 1. By way of example, but not limitation, the bias unit 112 shown in FIG. 1 is allowed to have additional cascode transistors included therein. The same objective of biasing the third transistor 110 to provide the bias current $I_B$ is achieved by such an alternative design. As the details of the constant transconductance bias structure are well known to those skilled in the pertinent art, further description is omitted here for brevity.

In addition, for the sake of power saving, the aspect ratio (W/L) of the third transistor 110 is M times as great as that of the first specific transistor 116. Thus, the bias current $I_B$ is M times as great as the current $I_C$ passing through the first specific transistor 116/second specific transistor 118. However, as the control voltage (i.e., gate voltage) of the third transistor 110 is controlled by the voltage level at node NX of the constant transconductance circuit 108, the noise interference at the node NX may be multiplied and injected into the bias current $I_B$. Therefore, the low-pass filter 114, including a resistive element R1 and a capacitive element C1, is coupled between the control nodes N33 and NX and implemented for blocking the undesired noise interference from affecting the gate voltage of the third transistor 110.

As will be detailed in the following, at least one of a resistive value of the specific resistive element 124, sizing of the third transistor 110, sizing of the first specific transistor 116, sizing of the second specific transistor 118, sizing of the third specific transistor 120, sizing of the fourth specific transistor 122 and sizing of the first transistor 102 would be properly configured to control the temperature dependency of a gate-source voltage of the first transistor 102. Therefore, with proper setting of above dominant factor(s), a temperature independent current or temperature compensated (dependent) current $I_R$ may be generated to meet requirements of a particular application.

The second transistor 104 and the passive component 106 form a source follower acting as a feedback control loop 105 used for forcing the current $I_A$ passing through the first transistor 102 to be substantially equal to the bias current $I_B$. Therefore, if the current $I_A$ passing through the first transistor 102 is smaller than the bias current $I_B$, the voltage at the control node N23 (i.e., the gate voltage) of the second transistor 104 goes down due to the greater bias current $I_B$ pulling down the gate voltage of the second transistor 104, thereby lowering the voltage at the first node N21 (i.e., the source voltage) of the second transistor 104. As the first node N21 of the second transistor 104 is coupled to the control node N13 of the first transistor 102, the voltage at the control node N13 (i.e., the gate voltage) of the first transistor 104 is pulled down, leading to an increased gate-source voltage between the control node (i.e., gate terminal) N13 and the first node (i.e., source terminal) N11. In this way, the current $I_A$ passing through the first transistor 102 is increased accordingly. Similarly, if the current $I_A$ passing through the first transistor 102 is greater than the bias current $I_B$, the feedback control loop 105 is operative to reduce the gate-source voltage of the first transistor 102, resulting in a reduced current $I_A$. To put it simply, the feedback control loop 105 will force the current $I_A$ passing through the first transistor 102 to be substantially equal to the bias current $I_B$ provided by the bias current generator 108.

As the passive component 106 is coupled between the first node N11 and the control node N13 of the first transistor 102, the current $I_R$ passing through the passive component 106 can be expressed as follows:

$$I_R = \frac{V_{gsa}}{R} \quad (1)$$

In above equation (1), $V_{gsa}$ represents the gate-source voltage of the first transistor 102, and R represents the resistive value of the passive component 106. Therefore, when the passive component 106 is tunable, the current $I_R$ can be adjusted by simply setting the resistive value R of the passive component 106.

In the following, a noise analysis and a temperature dependency analysis of the bias circuit 100 shown in FIG. 1 are given to more clearly describe technical features of the bias circuit 100.

The noise analysis is discussed first. Assume that the low-pass filter 114 is able to filter out the noise interference from the constant transconductance bias unit 112. Considering the thermal noise of the first transistor 102 and the third transistor 110 only, the noise current $I_n$ introduced due to the first transistor 102 and the third transistor 110 and the noise voltage $V_{na}$ at the control node N13 of the first transistor 102 can be expressed as follows:

$$I_n^2 = I_{na}^2 + I_{nb}^2 = 4kT\gamma(g_{ma} + g_{mb}) \quad (2)$$

$$V_{na}^2 = \frac{I_n^2}{g_{ma}^2} = 4kT\gamma \frac{1}{g_{ma}}\left(1 + \frac{g_{mb}}{g_{ma}}\right) \quad (3)$$

In above equations (2) and (3), $I_{na}$ is a noise term introduced due to the thermal noise of the first transistor 102, $I_{nb}$ is a noise term introduced due to the thermal noise of the third transistor 110, $g_{ma}$ is the transconductance of the first transistor 102, $g_{mb}$ is the transconductance of the third transistor 110, k is the Boltzmann constant, T is the absolute temperature, and γ is a constant based on the operational status of the transistor.

The noise current $I_{OUTn}$ generated from the bias circuit 100 is contributed by a thermal noise of the passive component 106 and the above-mentioned noise voltage $V_{na}$ divided by the resistive value R of the passive component 106, and can be expressed as follows:

$$I_{OUTn}^2 = \left(\frac{V_{na}}{R}\right)^2 + \frac{4kT}{R} = \frac{4kT}{R}\left[1 + \frac{\gamma\left(1 + \frac{g_{mb}}{g_{ma}}\right)}{g_{ma} \cdot R}\right] \xrightarrow{g_{ma} \cdot R \gg 1} \frac{4kT}{R} \quad (4)$$

As one can see from above equation (4), the noise power approaches thermal noise limit of the passive component 106 if the transconductance $g_{ma}$ of the first transistor 102 is large enough. In other words, if $g_{ma} \cdot R \gg 1$ (in general, the transconductance $g_{ma}$ is quite large), the noise from the first transistor 102 and the third transistor 110 is insignificant and negligible, leading to a low noise output bias current I_OUT due to the current $I_R$ with insignificant and negligible noise interference.

In an extreme case, the overdrive voltage $V_{ova}$ of the first transistor 102 may be minimized to make the threshold voltage $V_{tha}$ dominate the gate-source voltage $V_{gsa}$ of the first transistor 102, where $V_{ova} = V_{gsa} - V_{tha}$. Since the threshold voltage $V_{tha}$ is a noiseless physical quantity, the noise current generated from the bias circuit 100 will be determined by the thermal noise of the passive component 106 only.

Considering the case where a traditional current mirror is employed to provide the same current $I_R$, the corresponding current noise $I_{CMn}$ can be simply modeled as follows:

$$I_{CMn}^2 = 4kT\gamma g_{ma}' = 4kT\gamma \frac{2 \cdot I_R}{V_{ov}'} \quad (5)$$

In above equation (5), $g'_{ma}$ the transconductance of a particular transistor which outputs the mirrored current (i.e., the current $I_R$), and $V'_{ov}$ is the overdrive voltage of the particular transistor. Based on the above equations (1) and (4), the noise current $I_{OUTn}$ of the bias circuit 100 can be rewritten as follows:

$$I_{OUTn}^2 = \frac{4kT}{R} = 4kT\frac{I_R}{V_{gsa}} \quad (6)$$

Figure 2:
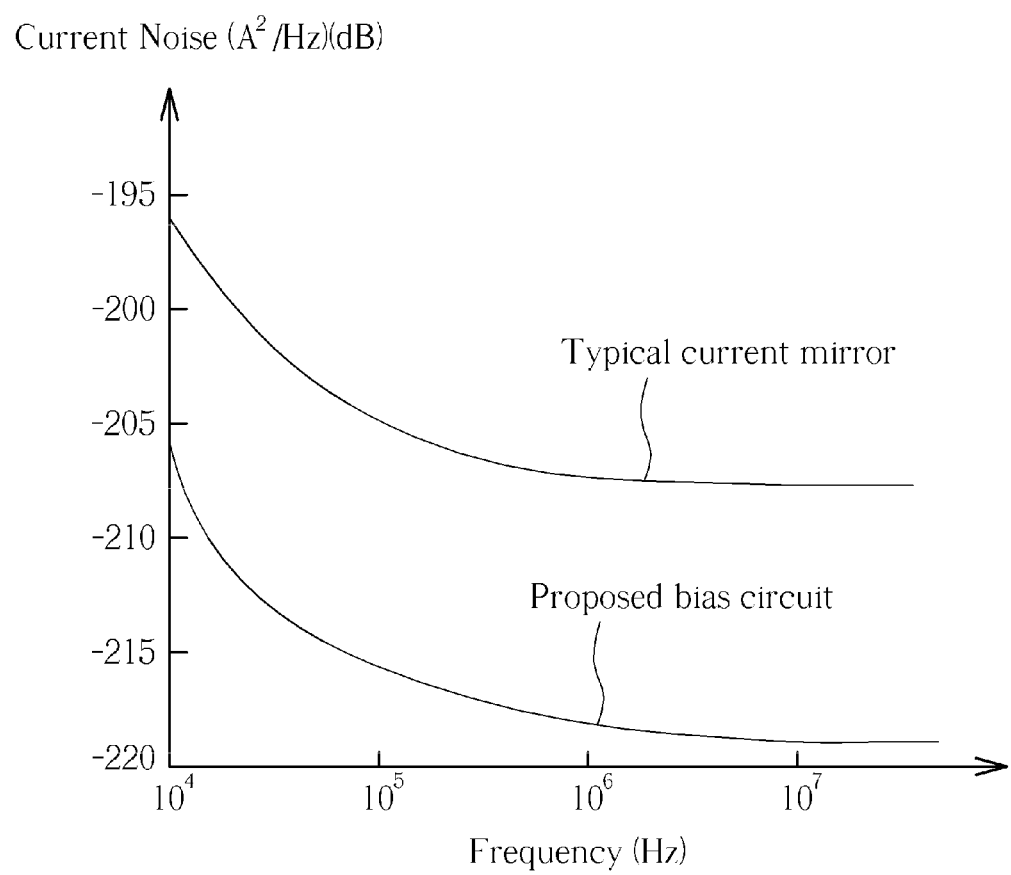
FIG. 2 shows an output current noise spectrum comparison between a traditional current mirror and the proposed bias circuit shown in FIG. 1.

Therefore, as one can see from equations (5) and (6), the overdrive voltage $V'_{ov}$ of the particular transistor included in the typical current mirror must be high enough (e.g., $V'_{ov} > 2V$ if $V_{gsa} \cong 1V$) to have the current noise $I_{CMn}$ comparable to the noise current $I_{OUTn}$. However, using a transistor with a high overdrive voltage (e.g., $V'_{ov} > 2V$) is not feasible in certain applications (e.g., an application with a 3V supply voltage). An output current noise spectrum comparison between a traditional current mirror and the proposed bias circuit 100 is illustrated in FIG. 2. The overdrive voltage of the typical current mirror is 0.4V. It is apparent that the current noise is reduced greatly in the proposed bias circuit design.

Next, the temperature dependency analysis is discussed hereinafter. As the current $I_A$ passing through the first transistor 102 will be equal to the bias current $I_B$ through the feedback control loop 105 mentioned above, where the bias current $I_B$ is M times as great as the current $I_C$ passing through the first specific transistor 116/second specific transistor 118, the overdrive voltage $V_{ova}$ of the first transistor 102 and the overdrive voltage $V_{ovc}$ of the second specific transistor 118 will satisfy the following equation:

$$\mu_a C_{OXa}\left(\frac{W}{L}\right)_a V_{ova}^2 = M * \mu_c C_{OXc}\left(\frac{W}{L}\right)_c V_{ovc}^2 \quad (7)$$

In above equation (7), $\mu_a$ is the carrier mobility of the first transistor 102, $\mu_c$ is the carrier mobility of the second specific transistor 118, $C_{OXa}$ is the oxide capacitance of the first transistor 102, $C_{OXc}$ is the oxide capacitance of the second specific transistor 118, $\left(\frac{W}{L}\right)_a$ is the aspect ratio of the first transistor 118, and $\left(\frac{W}{L}\right)_c$ is the aspect ratio of the second specific transistor 118. As the first transistor 102 and the second specific transistor 118 are PMOS transistors both manufactured by the same process, the first transistor 102 and the second specific transistor 118 therefore have the same carrier mobility and oxide capacitance. As $\mu_a = \mu_c = \mu$ and $C_{OXa} = C_{OXc} = C_{OX}$, the equation (7) can be rewritten as follows:

$$\frac{V_{ova}}{V_{ovc}} = \sqrt{\frac{M * \left(\frac{W}{L}\right)_c}{\left(\frac{W}{L}\right)_a}} \quad (8)$$

Moreover, for the constant transconductance bias unit 112, the resistive value $R_X$ of the specific passive component 124 and the transconductance value $g_{mc}$ satisfy the following equation, for example, if K is taken to be 4:

$$\frac{1}{R_X} = g_{mc} = \mu C_{OX} \left(\frac{W}{L}\right)_c V_{ovc} \quad (9)$$

Based on equation (9), the overdrive voltage $V_{ovc}$ of the second specific transistor 118 can be expressed as follows:

$$V_{ovc} = \frac{1}{R_X \mu C_{OX} \left(\frac{W}{L}\right)_c} \quad (10)$$

As can be seen from equation (10), the overdrive voltage $V_{ovc}$ of the second specific transistor 118 is inversely proportional to mobility, and will becomes larger at higher temperature due to the fact that the mobility is inversely proportional to the temperature. With the value $V_{ovc}$ expressed in equation (10) substituted into equation (8), the overdrive voltage $V_{ova}$ of the first transistor 102 can be rewritten as follows:

$$V_{ova} = \sqrt{\frac{M * \left(\frac{W}{L}\right)_c}{\left(\frac{W}{L}\right)_a}} * \frac{1}{R_X \mu C_{OX} \left(\frac{W}{L}\right)_c} \quad (11)$$

As mentioned above, $V_{ova} = V_{gsa} - V_{tha}$, that is, $V_{gsa} = V_{ova} + V_{tha}$. Because the threshold voltage $V_{tha}$ is inversely proportional to the temperature, the gate-source voltage $V_{gsa}$ may be temperature independent by making the overdrive voltage $V_{ova}$ proportional to the temperature to adequately compensate the change of the threshold voltage $V_{tha}$ caused by temperature variation. As can be seen from equation (11), the overdrive voltage $V_{ova}$ depends on at least the resistive value of the specific resistive element 124, the sizing of the second specific transistor 118 and the sizing of the first transistor 112. Therefore, as each of the values Rx, $\left(\frac{W}{L}\right)_a$ and $\left(\frac{W}{L}\right)_c$ would control the overdrive voltage $V_{ova}$, the resistive value of the specific resistive element 124, the sizing of the second specific transistor 118 and/or the sizing of the first transistor 102 can be properly configured to make the gate-source voltage $V_{gsa}$ of the first transistor 102 substantially temperature independent.

Please note that the currents passing through the transistors including 102, 110, 116, 118, 120, and 122 have a particular relationship due to the circuit configuration shown in FIG. 1. Therefore, the sizing of the third transistor 110, the sizing of the first specific transistor 116, the sizing of the third specific transistor 120, and/or the sizing of the fourth specific transistor 122 may also affect the temperature dependency of the overdrive voltage $V_{ova}$. To put it another way, at least one of the resistive value of the specific resistive element 124, the sizing of the first transistor 102, the sizing of the third transistor 110, the sizing of the first specific transistor 116, the sizing of the second specific transistor 118, the sizing of the third specific transistor 120, and the sizing of the fourth specific transistor 122 can be properly configured to make the gate-source voltage $V_{gsa}$ of the first transistor 102 substantially temperature independent.

As mentioned above, the current $I_R$ is equal to $\frac{V_{gsa}}{R}$ (equation (1)). In a case where the passive component 106 is implemented using a resistor/variable resistor, the temperature dependency of the current $I_R$ or the output bias current I_OUT will be determined by the gate-source voltage $V_{gsa}$ since the temperature coefficient of a resistor is small in CMOS process. As a result, the current $I_R$ will be temperature independent due to the temperature independent gate-source voltage $V_{gsa}$ realized by suitable transistor sizing and/or resistive value selection.

However, this is for illustrative purposes only, and is not meant to be a limitation to the present invention. Regarding a particular application which requires a bias current proportional or inversely proportional to the temperature, the gate-source voltage $V_{gsa}$ may be configured to be temperature dependent or compensated by suitable transistor sizing and resistive value selection. These alternative designs all fall within the scope of the present invention.

With proper configuration of the proposed bias circuit 100 shown in FIG. 1, the bias circuit 100 is capable of generating a temperature independent/temperature compensated current $I_R$ if the optional low-pass filter 114 is omitted, or generating a low noise, temperature independent/temperature compensated current $I_R$ if the optional low-pass filter 114 is not omitted. Therefore, when the proposed bias circuit structure is employed in a PLL circuit, the performance of the PLL circuit can be greatly improved.

Figure 3:
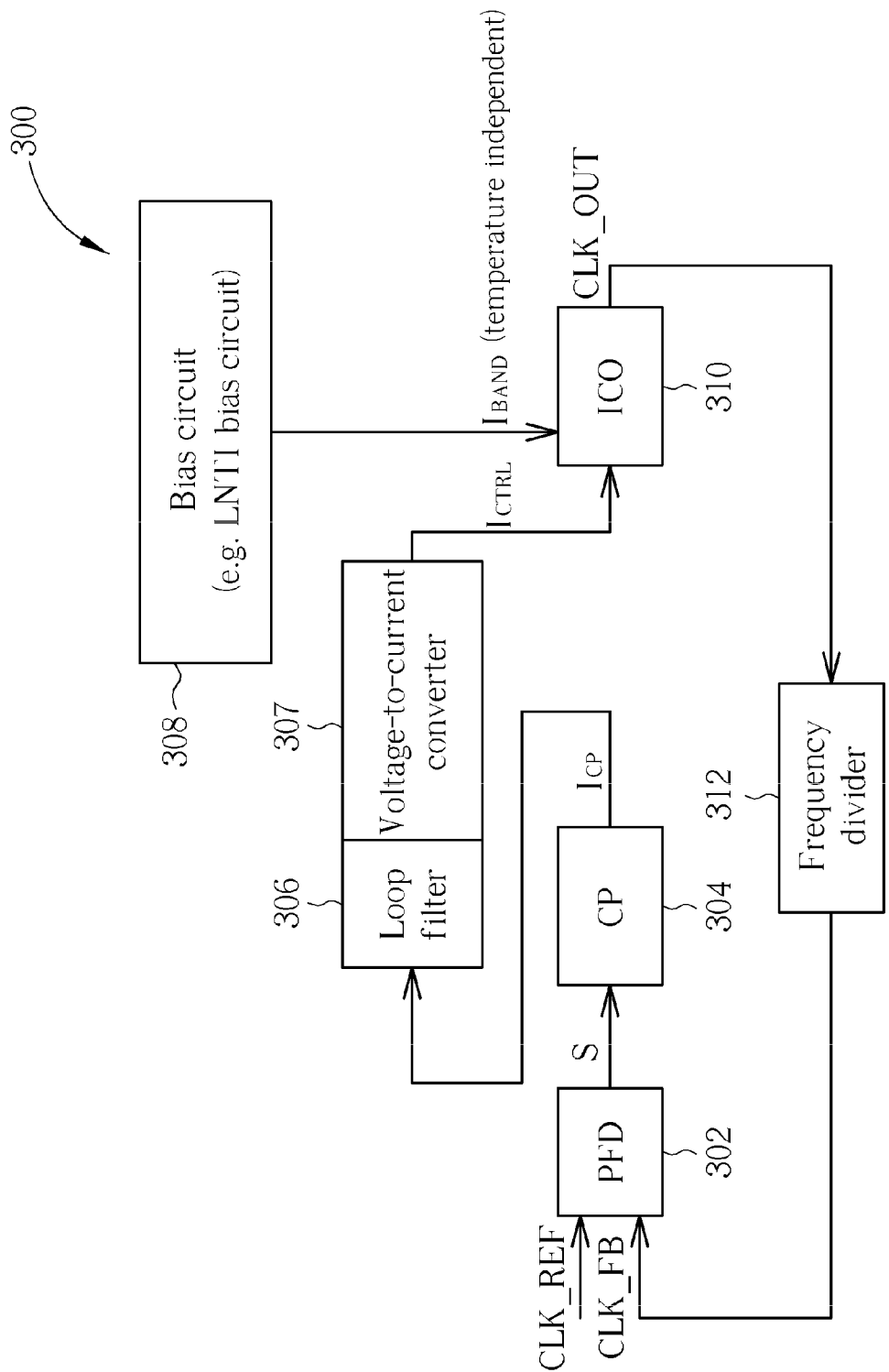
FIG. 3 is a block diagram illustrating a first exemplary implementation of a PLL circuit according to one embodiment of the present invention.

Please refer to FIG. 3, which is a block diagram illustrating a first exemplary implementation of a PLL circuit according to one embodiment of the present invention. The exemplary PLL circuit 300 includes, but is not limited to, a phase-frequency detector (PFD) 302, a charge pump (CP) 304, a loop filter 306, an optional voltage-to-current converter 307, a bias circuit (e.g., an LNTI bias circuit) 308, a current-controlled oscillator (ICO) 310, and a frequency divider 312. The PFD 302 is configured for comparing a reference clock signal CLK_REF with a feedback clock signal CLK_FB to generate a comparison result (e.g., a phase error signal) S, where the feedback clock signal CLK_FB is derived from an output clock signal CLK_OUT through the frequency divider 312. The CP 304 is coupled to the PFD 302 for generating a charge pump output $I_{CP}$ according to the comparison result S, and the loop filter 306 is coupled to the CP 304 for generating a control voltage $V_{CTRL}$, which is then transformed to a control current $I_{CTRL}$ through the voltage-to-current converter 307, according to the charge pump output $I_{CP}$. Please note that the loop filter 306 and the voltage-to-current converter 307 are shown as two distinct functional blocks for illustrating one example of generating the control current $I_{CTRL}$. This is for illustrative purposes only, and is not meant to be taken as a limitation to the scope of the present invention. The implementation of the voltage-to-current converter 307 is based on the actual PLL design and may be optional. For example, in one exemplary PLL design, the voltage-to-current converter 307 may be omitted when the loop filter 306 implemented in the PLL circuit 300 is capable of generating and outputting the control current $I_{CTRL}$ according to the received charge pump output $I_{CP}$. In another exemplary PLL design, the voltage-to-current converter 307 may be integrated into the loop filter 306. To put it simply, any circuit which can generate the desired control current $I_{CTRL}$ according to the incoming charge pump output $I_{CP}$ may be employed to serve as a loop filter disposed between the CP 304 and the ICO 306 of the PLL circuit 300.

The ICO 310 is controlled according to the control current $I_{CTRL}$ generated from the loop filter 306 and a band selection current $I_{BAND}$ generated from the bias circuit 308, and accordingly generates the output clock signal CLK_OUT. For example, the ICO 310 is controlled according to a sum of the control current $I_{CTRL}$ and the band selection current $I_{BAND}$. More specifically, the process variation of the ICO 310 can be calibrated by adjusting the band selection current $I_{BAND}$, leaving only temperature variation required to be covered by the control current $I_{CTRL}$ which is modulated by a PLL control voltage. In this way, a very low VCO gain $K_{VCO}$ can be achieved since only the temperature variation of the ICO 310 needs to be compensated in a continuous locking process.

Figure 4:
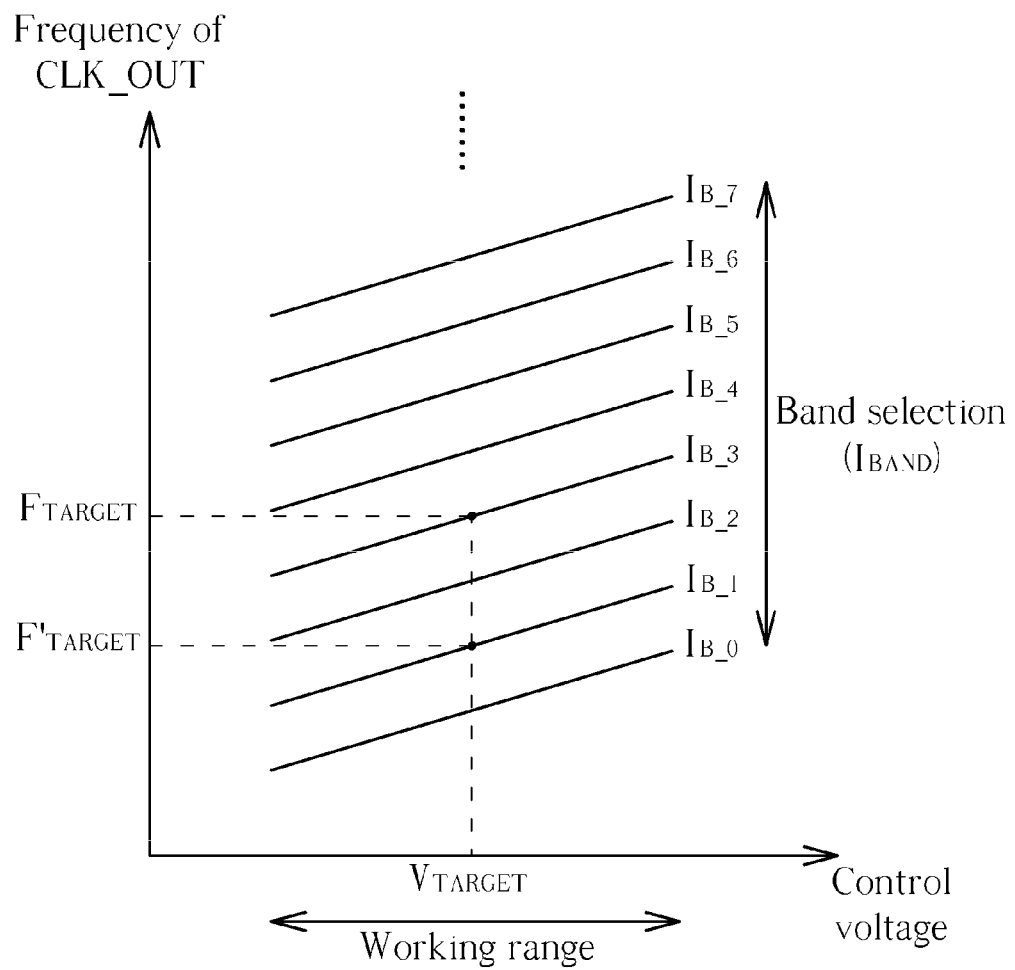
FIG. 4 is a diagram showing the characteristic of an output frequency and a control voltage.

Please refer to FIG. 4, which is a diagram showing the characteristic of the output frequency and the control voltage. As the ICO 310 generates the output clock signal CLK_OUT according to a band selection current $I_{BAND}$ and a control current $I_{CTRL}$ (which is modulated by a PLL control voltage $V_{CTRL}$), the frequency $F_O$ of the output clock signal CLK_OUT can be expressed as follows:

$$F_O = F_{BAND} + K_{VCO} \cdot V_{CTRL} \qquad (12)$$

In above equation (12), $F_{BAND}$ is the target frequency (frequency offset) of the output clock signal CLK_OUT under a target control voltage $V_{TARGET}$ which is generally a midpoint of a working range of the PLL control voltage, and selected by the band selection current $I_{BAND}$. For example, if the target frequency of the output clock signal CLK_OUT is $F_{TARGET}$, the required band selection current $I_{BAND}$ is $I_{B\_3}$; on the other hand, if the target frequency of the output clock signal CLK_OUT is $F'_{TARGET}$, the required band selection current $I_{BAND}$ is $I_{B\_1}$. The term $K_{VCO} \cdot V_{CTRL}$ in above equation (12) is to compensate ICO's temperature variation only. In the proposed structure, most of the bias current injected into the ICO 310 is from the bias circuit 308 and dominates the ICO phase noise performance. Therefore, noise power of the band selection current $I_{BAND}$ must be minimized. Furthermore, it is important that the band selection current $I_{BAND}$ keeps constant while temperature varies; otherwise, the variation of the band selection current $I_{BAND}$ has to be compensated by the control current $I_{CTRL}$. In this exemplary embodiment, the bias circuit 308 is therefore implemented using the bias circuit structure shown in FIG. 1. Thus, a temperature independent band selection current $I_{BAND}$ can be provided by the bias circuit 308.

In summary, due to the particularly designed bias circuit structure, the resistive value of the passive component (e.g., a resistor) 106 and the gate-source voltage of the first transistor 102 dominate the current $I_R$ passing through the passive component 106, where the current $I_R$ may be used to act as a band selection current $I_{BAND}$ of an ICO implemented in a PLL application. As mentioned above, the current $I_R$ may be affected by thermal noise of the passive component 106 only when the low-pass filter 114 is implemented. Thus, a low noise current $I_R$ can be produced. In addition, the temperature coefficient of a resistor is small in the CMOS process. Therefore, by properly configuring the circuit elements (e.g., the specific passive component 124, the first specific transistor 116, the second specific transistor 118, the third specific transistor 120, the fourth specific transistor 122, the first transistor 102, and/or the third transistor 110) of the proposed bias circuit to make the gate-source voltage of the first transistor 102 substantially temperature independent, a temperature independent current $I_{BAND}$ can be produced.

Figure 5:
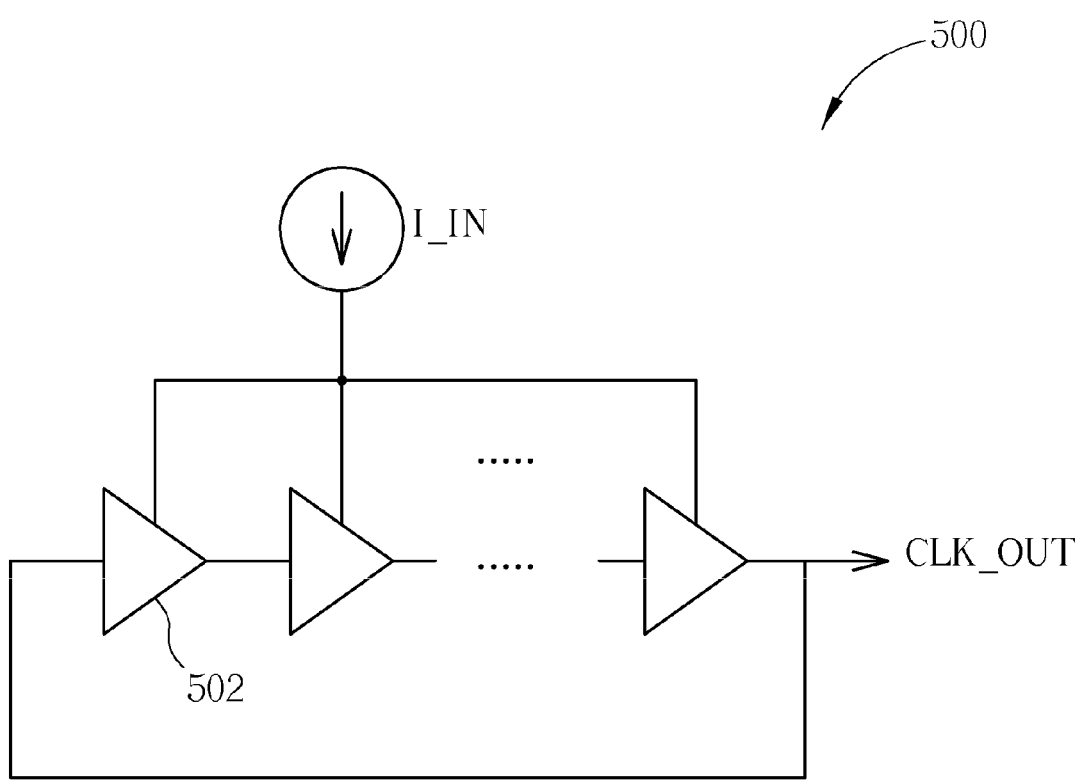
FIG. 5 is a diagram illustrating an exemplary implementation of an ICO according to one embodiment of the present invention.
Figure 6:
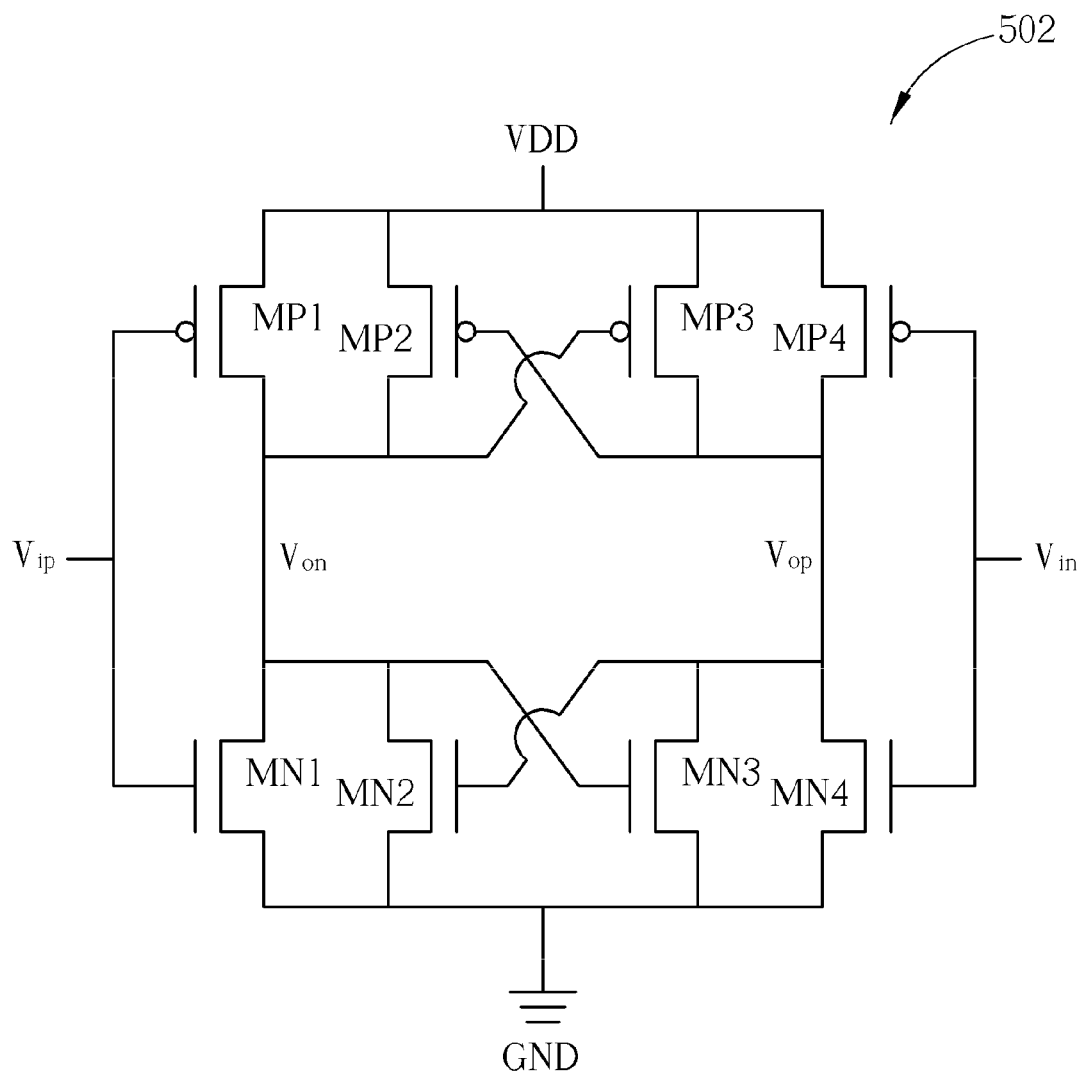
FIG. 6 is a diagram illustrating an exemplary implementation of an ICO delay cell implemented in the ICO shown in FIG. 5.

Please refer to FIG. 5 in conjunction with FIG. 6. FIG. 5 is a diagram illustrating an exemplary implementation of an ICO according to one embodiment of the present invention. FIG. 6 is a diagram illustrating an exemplary implementation of an ICO delay cell. The exemplary ICO 500 includes a plurality of ICO delay cells 502 connected in a ring manner. In addition, the ICO 500 may be employed to realize the ICO 310 shown in FIG. 3 for generating the output clock signal CLK_OUT. Therefore, the ICO 500 is controlled by a bias current I_IN which is composed of the control current $I_{CTRL}$ generated from the loop filter 306 and the band selection current $I_{BAND}$ generated from the bias circuit 308. The ICO delay cell 502 includes a plurality of transistors MP1-MP4 and MN1-MN4 arranged in a cross-coupling configuration. The ICO delay cell 502 receives $V_{ip}$ and $V_{in}$ from a preceding ICO delay cell, and outputs $V_{op}$ and $V_{on}$ to a following ICO delay cell. The bias current I_IN is injected into the ICO delay cells 502, and the supply voltage VDD of each ICO delay cell 502 is developed due to the injected bias current I_IN. Provided that shoot through current is ignored when PMOS/NMOS transistors are both turned on, the current I injected into the ICO delay cell 502 and the resultant oscillation frequency f of the ICO delay 502 have the following relationship:

$$f \propto \frac{I}{C * VDD} \qquad (13)$$

Figure 7:
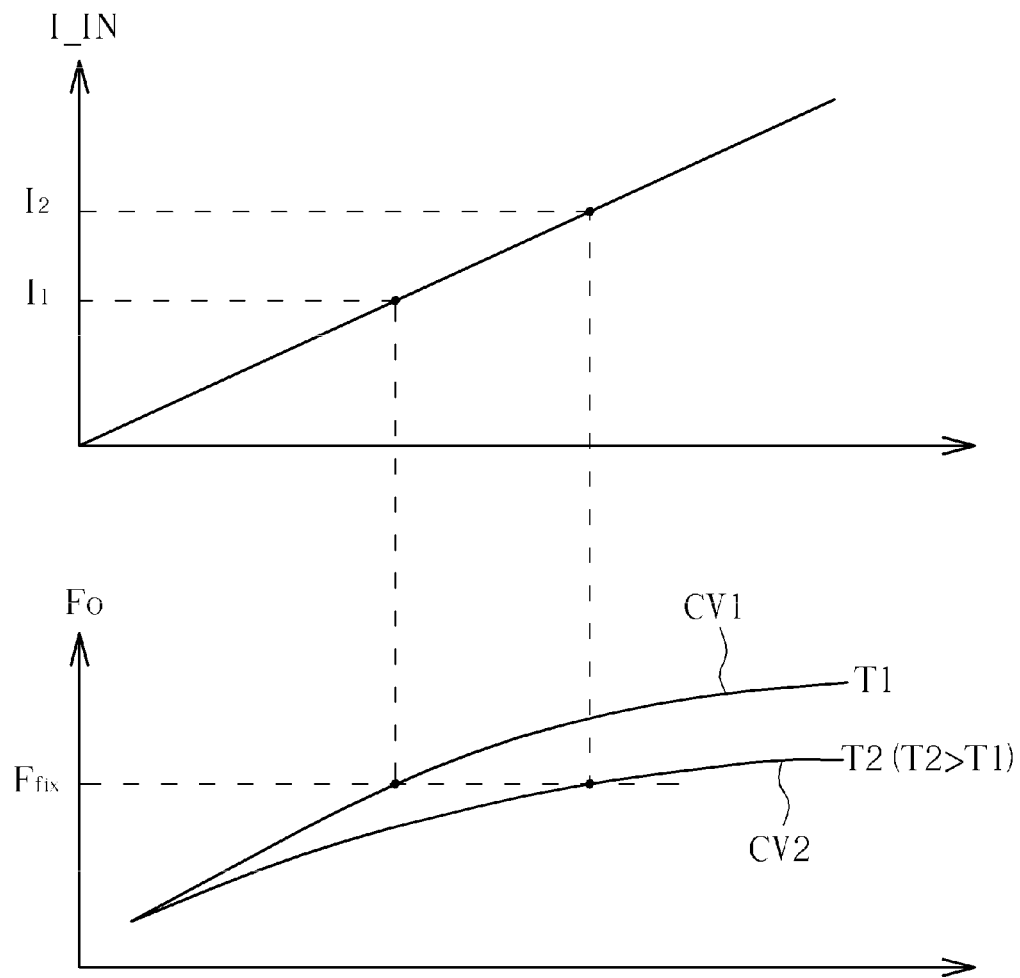
FIG. 7 is a diagram illustrating an exemplary relationship between an oscillation frequency of an output clock signal and an injected output bias current.

In above equation (13), C simply represents the equivalent nodal capacitance of the ICO delay cell 502. In a case where the current I injected into the ICO delay cell 502 is fixed regardless of temperature variation, the supply voltage VDD will be larger under a higher temperature condition due to larger overdrive voltage needed. As can be seen from equation (13), the oscillation frequency f will be inversely proportional to the developed supply voltage VDD when the current I is fixed. That is, when the developed supply voltage VDD is increased due to higher temperature, the oscillation frequency f will be decreased. In view of this, when the ICO 500 is operated under high temperature, more current is needed to keep the oscillation frequency fixed. FIG. 7 is a diagram illustrating one exemplary relationship between the oscillation frequency $F_O$ of the output clock signal CLK_OUT and the injected bias current I_IN. The characteristic curve CV1 is measured under the temperature T1, and the characteristic curve CV2 is measured under the temperature T2 (T2>T1). To keep the fixed oscillation frequency $F_{fix}$, the injected bias current I_IN is increased from one current value I1 under the lower temperature T1 to another current value I2 under the higher temperature T2.

Regarding the aforementioned PLL circuit 300 with the bias circuit 308 which generates the temperature independent band selection current $I_{BAND}$, the current variation of the ICO 310 needs to be compensated in a continuous locking process by adjusting the control current $I_{CTRL}$. However, in an alternative design of the present invention, both of the process variation and current variation of the ICO 310 may be calibrated by the band selection current $I_{BAND}$. In this way, compared to the VCO gain $K_{VCO}$ of the PLL circuit 300, the VCO gain $K_{VCO}$ of the PLL circuit 800 can be further lowered.

Figure 8:
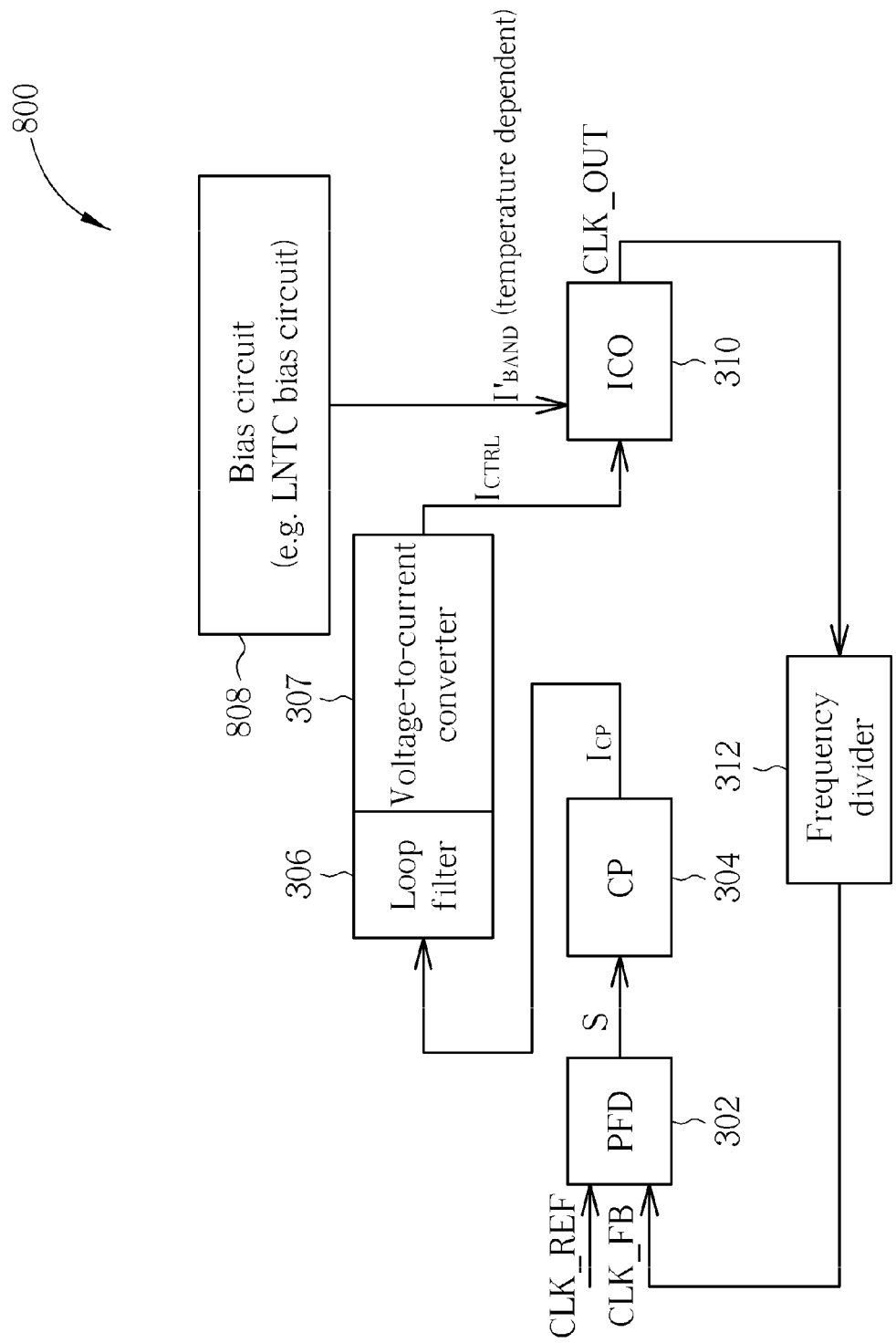
FIG. 8 is a block diagram illustrating a second exemplary implementation of a PLL circuit according to another embodiment of the present invention.

Please refer to FIG. 8, which is a block diagram illustrating a second exemplary implementation of a PLL circuit according to another embodiment of the present invention. The major difference between the PLL circuit 800 and the PLL circuit 300 is that the exemplary PLL circuit 800 uses a bias circuit (e.g., an LNTC bias circuit) 808 to generate a temperature compensated band selection current $I'_{BAND}$. In this exemplary embodiment, the bias circuit 808 can be implemented using the same bias circuit structure shown in FIG. 1 by properly configuring at least one of the resistive value of the specific resistive element 124, sizing of the first transistor 102, sizing of the third transistor 110, sizing of the first specific transistor 116, sizing of the second specific transistor 118, sizing of the third specific transistor 120, and sizing of the fourth specific transistor 122. In this way, the temperature dependency of the gate-source voltage of the first transistor 102 is adequately set to make the current $I_R$ become temperature compensated (dependent).

In this exemplary embodiment, the band selection current $I'_{BAND}$ will be increased when the temperature increases, and the band selection current $I'_{BAND}$ will be decreased when the temperature decreases. More specifically, the band selection current $I'_{BAND}$ is designed to be proportional to the temperature.

Regarding the bias circuit 808 of the PLL circuit 800, each of the first transistor 102, the second specific transistor 118 and the fourth specific transistor 122 may be implemented by a transistor fabricated by a process also utilized for fabricating at least one transistor utilized in the ICO delay cell of the ICO 310. For example, transistors MP1-MP4 (e.g., p-channel metal oxide semiconductor (PMOS) transistors) are core devices each having a gate oxide layer thinner than that of an IO device. Therefore, the first transistor 102, the second specific transistor 118 and the fourth specific transistor 122 are implemented by core PMOS transistors. In other words, each of the first transistor 102, the second specific transistor 118 and the fourth specific transistor 122 has a gate oxide layer with a thickness substantially identical to a thickness of a gate oxide layer of each core PMOS transistor included in the ICO 310. In this way, as the process variation is also taken into consideration to determine the actual implementation of the first transistor 102, the second specific transistor 118 and the fourth specific transistor 122, the bias circuit 808 can track the current variation of the ICO 310 more precisely.

Figure 9:
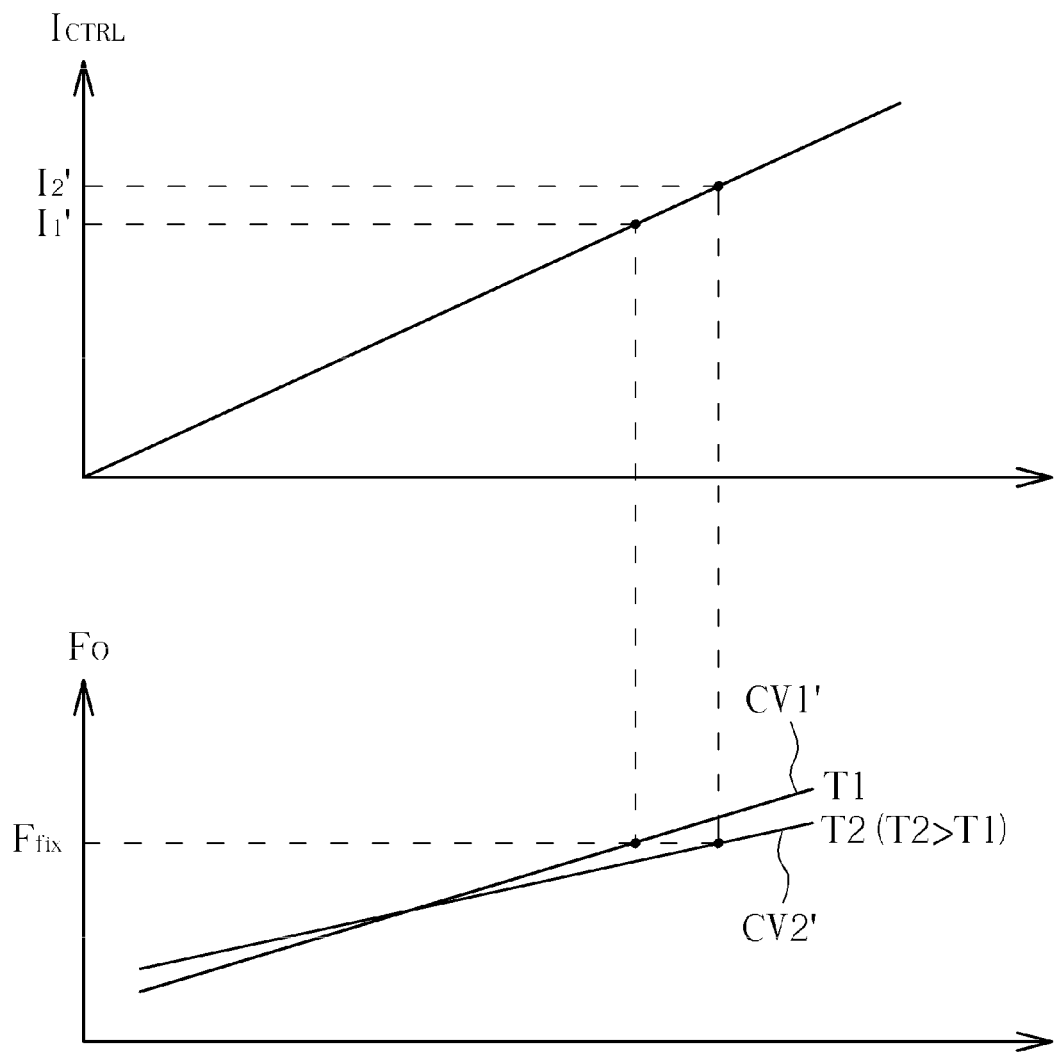
FIG. 9 is a diagram illustrating an exemplary relationship between the oscillation frequency of the output clock signal and an injected control current while a band selection current is configured to compensate temperature variation of the ICO.

As the bias circuit 808 is properly configured to generate the temperature compensated band selection current $I'_{BAND}$ to partially or totally compensate the current variation of the ICO 310 in response to temperature variation, the control effort of the continuous PLL locking process used for adjusting the control current $I_{CTRL}$ can be mitigated. FIG. 9 is a diagram illustrating an exemplary relationship between the oscillation frequency $F_O$ of the output clock signal CLK_OUT and the injected control current $I_{CTRL}$ while $I'_{BAND}$ is configured to compensate temperature variation of ICO 310. The characteristic curve CV1' is measured under the lower temperature T1, and the characteristic curve CV2' is measured under the higher temperature T2 (T2>T1). To keep the fixed oscillation frequency $F_{fix}$, the control current $I_{CTRL}$ is increased from one current value I1' under the lower temperature T1 to another current value I2' under the higher temperature T2. It should be noted that the current variation to be compensated by the control current $I_{CTRL}$ is effectively reduced due to the temperature compensated band selection current $I'_{BAND}$. For example, in a case where an LNTI bias circuit is employed to make the band selection current temperature independent, the current variation from 0 degree to 120 degrees is 460 u; however, in another case where an LNTC bias circuit is employed to make the band selection current temperature compensated (dependent), the current variation from 0 degree to 120 degrees is 70 u only.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bias circuit for generating an output bias current, comprising:
    a first transistor, having a first node coupled to a first reference voltage, a second node, and a control node;
    a passive component, coupled between the first reference voltage and the control node of the first transistor;
    a second transistor, having a first node coupled to the control node of the first transistor, a control node coupled to the second node of the first transistor, and a second node for providing the output bias current according to a current passing through the passive component; and
    a bias current generator, coupled to the second node of the first transistor, for providing the first transistor with a bias current;
wherein a gate-source voltage of the first transistor is substantially temperature independent; a ratio of the output bias current to the bias current is not fixed when a current passing through the first transistor is not equal to the bias current; and the current passing through the first transistor is arranged to be forced to substantially equal the bias current.

2. The bias circuit of claim 1, wherein the passive component is a resistive element.

3. The bias circuit of claim 2, wherein the resistive element is a variable resistor arranged for adjusting the current passing therethrough.

4. The bias circuit of claim 1, wherein the bias current generator comprises:
    a third transistor, having a first node coupled to the second node of the first transistor, a second node coupled to a second reference voltage, and a control node; and a bias unit, coupled to the control node of the third transistor, for biasing the third transistor to provide the bias current.

5. The bias circuit of claim 4, wherein the bias unit is a constant transconductance bias unit having a first specific transistor with a control node coupled to the control node of the third transistor.

6. The bias circuit of claim 5, wherein the constant transconductance bias unit further includes a second specific transistor, a third specific transistor with a control node coupled to the control node of the third transistor, a fourth specific transistor, and a specific resistive element, the first specific transistor and the second specific transistor are connected in a cascode fashion, the third specific transistor and the fourth specific transistor are connected in a cascode fashion, and at least one of a resistive value of the specific resistive element, sizing of the first specific transistor, sizing of the second specific transistor, sizing of the third specific transistor, sizing of the fourth specific transistor, sizing of the first transistor, and sizing of the third transistor is configured to make the gate-source voltage of the first transistor substantially temperature independent.

7. The bias circuit of claim 5, wherein the bias current generator further comprises a low-pass filter coupled between the control node of the first specific transistor and the control node of the third transistor.

8. The bias circuit of claim 1, wherein one of the bias current and the output bias current is not a current generated from a current mirror based on another of the bias current and the output bias current.

9. A phase-locked loop (PLL) circuit, comprising:
a phase-frequency detector (PFD), configured for comparing a reference clock signal with a feedback clock signal to generate a comparison result;
a charge pump, for generating a charge pump output according to the comparison result;
a loop filter, for generating a control current according to the charge pump output;
a bias circuit, comprising:
  a first transistor, having a first node coupled to a first reference voltage, a second node, and a control node;
  a passive component, coupled between the first reference voltage and the control node of the first transistor;
  a second transistor, having a first node coupled to the control node of the first transistor, a control node coupled to the second node of the first transistor, and a second node for providing a band selection current passing through the passive component; and
  a bias current generator, coupled to the second node of the first transistor, for providing the first transistor with a bias current; and
a current-controlled oscillator (ICO), for generating an output clock signal according to the band selection current and the control current, wherein the feedback clock signal is derived from the output clock signal;
wherein a gate-source voltage of the first transistor is substantially temperature independent; and the band selection current passes through the second transistor and also flows into the ICO.

10. The PLL circuit of claim 9, wherein the passive component is a resistive element.

11. The PLL circuit of claim 9, wherein the resistive element is a variable resistor arranged for adjusting the band selection current.

12. The PLL circuit of claim 9, wherein the bias current generator comprises:

a third transistor, having a first node coupled to the second node of the first transistor, a second node coupled to a second reference voltage, and a control node; and
a bias unit, coupled to the control node of the third transistor, for biasing the third transistor to provide the bias current.

13. The PLL circuit of claim 12, wherein the bias unit is a constant transconductance bias unit having a first specific transistor with a control node coupled to the control node of the third transistor.

14. The PLL circuit of claim 13, wherein the constant transconductance bias unit further includes a second specific transistor, a third specific transistor with a control node coupled to the control node of the third transistor, a fourth specific transistor, and a specific resistive element, the first specific transistor and the second specific transistor are connected in a cascode fashion, the third specific transistor and the fourth specific transistor are connected in a cascode fashion, and at least one of a resistive value of the specific resistive element, sizing of the first specific transistor, sizing of the second specific transistor, sizing of the third specific transistor, sizing of the fourth specific transistor, sizing of the first transistor, and sizing of the third transistor is arranged to make the gate-source voltage of the first transistor substantially temperature independent.

15. The PLL circuit of claim 13, wherein the bias current generator further comprises a low-pass filter coupled between the control node of the first specific transistor and the control node of the third transistor.

16. The PLL circuit of claim 9, wherein the current passing through the first transistor is arranged to be forced to substantially equal the bias current; and one of the bias current and the band selection current is not a current generated from a current mirror based on another of the bias current and the band selection current.

17. The PLL circuit of claim 9, wherein the second node of the second transistor is directly connected to the ICO, and the band selection current is directly supplied to the ICO from the second node of the second transistor.

18. A phase-locked loop (PLL) circuit, comprising:
a phase-frequency detector (PFD), configured for comparing a reference clock signal with a feedback clock signal to generate a comparison result;
a charge pump, for generating a charge pump output according to the comparison result;
a loop filter, for generating a control current according to the charge pump output;
a bias circuit, comprising:
  a first transistor, having a first node coupled to a first reference voltage, a second node, and a control node;
  a passive component, coupled between the first reference voltage and the control node of the first transistor;
  a second transistor, having a first node coupled to the control node of the first transistor, a control node coupled to the second node of the first transistor, and a second node for providing a band selection current passing through the passive component; and
  a bias current generator, coupled to the second node of the first transistor, for providing the first transistor with a bias current; and
a current-controlled oscillator (ICO), for generating an output clock signal according to the band selection current and the control current, wherein the feedback clock signal is derived from the output clock signal;
wherein a gate-source voltage of the first transistor is temperature dependent, and makes the band selection current temperature dependent and substantially compensate a current variation of the ICO that is caused by a temperature variation.

19. A bias circuit, comprising:
a first transistor, having a first node coupled to a first reference voltage, a second node, and a control node;
a feedback control loop, coupled between the control node and the second node of the first transistor, wherein the feedback control loop is arranged to force a current passing through the first transistor substantially equal to a bias current;
a second transistor, having a first node coupled to the second node of the first transistor, a second node coupled to a second reference voltage, and a control node; and
a constant transconductance bias unit, coupled to the control node of the second transistor, for biasing the second transistor to provide the bias current and making a gate-source voltage of the first transistor substantially temperature independent;
wherein a ratio of a current passing through the feedback control loop to the bias D current is not fixed when the current passing through the first transistor is not equal to the bias current.

20. The bias circuit of claim 19, wherein the constant transconductance bias unit has a first specific transistor with a control node coupled to the control node of the second transistor, a second specific transistor, a third specific transistor with a control node coupled to the control node of the third transistor, a fourth specific transistor, and a specific resistive element, the first specific transistor and the second specific transistor are connected in a cascode fashion, the third specific transistor and the fourth specific transistor are connected in a cascode fashion, and at least one of a resistive value of the specific resistive element, sizing of the first specific transistor, sizing of the second specific transistor, sizing of the third specific transistor, sizing of the fourth specific transistor, sizing of the first transistor, and sizing of the third transistor is arranged to make the gate-source voltage of the first transistor substantially temperature independent.

21. The bias circuit of claim 20, further comprising:
a low-pass filter coupled between the control node of the first specific transistor and the control node of the second transistor.

22. The bias circuit of claim 19, being employed in a phase-locked loop (PLL) circuit.

23. The bias circuit of claim 19, wherein one of the current passing through the feedback control loop and the bias current is not a current generated from a current mirror based on another of the current passing through the feedback control loop and the bias current.

24. A bias circuit for generating an output bias current, comprising:
a first transistor, having a first node coupled to a first reference voltage, a second node, and a control node;
a passive component, coupled between the first reference voltage and the control node of the first transistor;
a second transistor, having a first node coupled to the control node of the first transistor, a control node coupled to the second node of the first transistor, and a second node for providing the output bias current according to a current passing through the passive component; and a bias current generator, coupled to the second node of the first transistor, for providing the first transistor with a bias current;
wherein a gate-source voltage of the first transistor is substantially temperature independent; and the bias current generator comprises:
a third transistor, having a first node coupled to the second node of the first transistor, a second node coupled to a second reference voltage, and a control node; and
a bias unit, coupled to the control node of the third transistor, for biasing the third transistor to provide the bias current, wherein the bias unit is a constant transconductance bias unit having a first specific transistor with a control node coupled to the control node of the third transistor; the constant transconductance bias unit further includes a second specific transistor, a third specific transistor with a control node coupled to the control node of the third transistor, a fourth specific transistor, and a specific resistive element; the first specific transistor and the second specific transistor are connected in a cascode fashion; the third specific transistor and the fourth specific transistor are connected in a cascode fashion; and at least one of a resistive value of the specific resistive element, sizing of the first specific transistor, sizing of the second specific transistor, sizing of the third specific transistor, sizing of the fourth specific transistor, sizing of the first transistor, and sizing of the third transistor is configured to make the gate-source voltage of the first transistor substantially temperature independent.

25. A bias circuit, comprising:
a first transistor, having a first node coupled to a first reference voltage, a second node, and a control node;
a feedback control loop, coupled between the control node and the second node of the first transistor, wherein the feedback control loop is arranged to force a current passing through the first transistor substantially equal to a bias current;
a second transistor, having a first node coupled to the second node of the first transistor, a second node coupled to a second reference voltage, and a control node; and
a constant transconductance bias unit, coupled to the control node of the second transistor, for biasing the second transistor to provide the bias current and making a gate-source voltage of the first transistor substantially temperature independent;
wherein the constant transconductance bias unit has a first specific transistor with a control node coupled to the control node of the second transistor, a second specific transistor, a third specific transistor with a control node coupled to the control node of the third transistor, a fourth specific transistor, and a specific resistive element, the first specific transistor and the second specific transistor are connected in a cascode fashion, the third specific transistor and the fourth specific transistor are connected in a cascode fashion, and at least one of a resistive value of the specific resistive element, sizing of the first specific transistor, sizing of the second specific transistor, sizing of the third specific transistor, sizing of the fourth specific transistor, sizing of the first transistor, and sizing of the third transistor is arranged to make the gate-source voltage of the first transistor substantially temperature independent.

* * * * *